United States Patent [19]

Kumar

[11] Patent Number: 5,568,433
[45] Date of Patent: Oct. 22, 1996

[54] MEMORY ARRAY HAVING REDUNDANT WORD LINE

[75] Inventor: Manoj Kumar, Austin, Tex.

[73] Assignee: International Business Machines Corporation, Armonk, N.Y.

[21] Appl. No.: 491,661

[22] Filed: Jun. 19, 1995

[51] Int. Cl.[6] .................................................. G11C 29/00
[52] U.S. Cl. ................ 365/200; 365/230.03; 365/230.06
[58] Field of Search .............................. 365/200, 189.08, 365/195, 230.03, 230.06

[56]          References Cited
         U.S. PATENT DOCUMENTS

| 4,365,319 | 12/1982 | Takemae | 365/200 |
|---|---|---|---|
| 4,723,227 | 2/1988 | Murotani | 365/200 |
| 4,745,582 | 5/1988 | Fukushi et al. | 365/200 |
| 4,858,192 | 8/1989 | Tatsumi et al. | 365/200 |
| 4,905,192 | 2/1990 | Nogami et al. | 365/200 |
| 4,951,253 | 8/1990 | Sahara et al. | 365/200 |
| 5,107,464 | 4/1992 | Sahara et al. | 365/200 |
| 5,235,548 | 8/1993 | Kurkowski | 365/200 |
| 5,276,360 | 1/1994 | Fujima | 307/441 |
| 5,327,380 | 7/1994 | Kersh, III et al. | 365/200 |

FOREIGN PATENT DOCUMENTS 2-035698   2/1990   Japan .

*Primary Examiner*—Tan T. Nguyen
*Attorney, Agent, or Firm*—Anthony V. S. England; Jenkens & Gilchrist, P.C.

[57]                ABSTRACT

Multiselection of word lines is eliminated in a memory array which includes a word line generation circuit which inhibits line selection until a latest address bit is received.

4 Claims, 9 Drawing Sheets

MEMORY ARRAY HAVING REDUNDANT WORD LINE

BACKGROUND OF THE INVENTION

1. Field of the Invention

The present invention relates to storage systems for data processing and more particularly to such storage systems having redundant circuits.

2. Prior Art

The following United States Patents and Japanese published application exemplify the state of the art with regard to semiconductor memory arrays having redundant circuits.

U.S. Pat. No. 5,235,548, entitled "Memory With Power Supply Intercept in Redundancy Logic", teaches a conventional low power SRAM with redundant rows in each subarray including power supply disconnect logic to disconnect supply voltage line for a bad row in the array.

Although the '548 patent generally related to memory arrays having redundant logic, the key element of the invention of the '548 patent is the logic for disconnecting the supply voltage from the bad row.

Japanese published application 02-035698 teaches a memory array in which a delay circuit between address input and word line is eliminated by inserting a fuse between a word line driving circuit and the word line and disconnecting the fuse in the case of replacing the word line by a spare word line.

The published application is a good example of the fundamental technique of using fused lines to select between primary and redundant word lines.

However, the published application does not teach Applicant's invention as shown and claimed herein.

U.S. Pat. No. 5,107,464, entitled "Semiconductor Memory System", teaches a semiconductor memory system having a redundant column which is used for replacing a defective column wherein redundant data lines are connected to the redundant column through a redundant column selection gate. A defective address detection circuit detects the address of a defective column to enable the redundant column selection gate. A redundant column selection circuit selects the redundant column in response to a detection signal from the defective address detection circuit. A data line switching circuit switches in redundant column select mode the data lines connecting to a data input/output drive circuit from the regular data lines to the redundant data lines.

A circuit according to the '464 patent separates the regular data lines from the input/output drive circuit and thus prevents error data from a defective column from being output from the memory array.

Although the '464 patent teaches a means for replacing a defective column with a redundant column, it does not teach the invention shown and claimed herein. U.S. Pat. No. 4,951,253, entitled "Semiconductor Memory System", teaches the same memory system as does U.S. Pat. No. 5,107,464 discussed above. As stated with respect to the '464 patent, the '253 patent does not teach or suggest the invention disclosed and claimed herein.

U.S. Pat. No. 4,905,192, entitled "Semiconductor Memory Cell", teaches a memory cell array including a spare memory cell array having a first address circuit for designating an address in the memory cell array a second address circuit for designating an address in the spare memory cell array. An error detection circuit for predetermined output based on whether the memory spare array has a fault and a select circuit responsive to the output from the error detection circuit for supplying an activation signal to the select line at an earlier time when there is no fault in the memory array cell and supplying an activation signal delayed by a time necessary for the selection of the spare memory cell array when there is a fault in the memory cell array.

The '192 patent is an example of a prior art implementation which creates a problem solved by the invention shown and claimed herein.

U.S. Pat. No. 4,365,319, entitled "Semiconductor Memory Device", teaches a semiconductor device in which a redundancy memory cell array is incorporated with the main memory cell array. The memory cell array is selected by two sets of decoders and drivers. When the redundant memory cell array is selected by a decoder, the decoder disables one of the sets of decoders and drivers directly, and as a result the other set of decoders and drivers are also disabled.

The '319 patent does not teach nor suggest the invention shown and claimed herein.

U.S. Pat. No. 4,723,227, entitled "Redundant Type Memory Circuit With and Improved Clock Generator", teaches a redundant memory circuit having a normal memory cell array, a decoder circuit for operatively accessing the normal array, a redundant array, a decoder circuit for accessing the redundant array, and a programmable timing control circuit for enabling the first decoder in a first delay period when no fault cell exists in the normal array and at a second longer delay period when a faulty cell exists in the normal array.

The '227 patent has many similarities to the '192 patent described above, in that delay is inserted in the selection of an address for the redundant array if a fault exists in the normal array. However, the patent does not teach nor suggest the invention shown and claimed herein.

U.S. Pat. No. 5,276,360, entitled "Redundant Control Circuit Incorporated in Semiconductor Integrated Circuit Device for Producing Control Signal Indicative of Replacement with Redundant Unit", teaches a control circuit which compares a defective address with an external address to determine whether a redundant word line is driven for a read operation instead of a defective word line assigned to the defective address and keeps a redundant control signal on a precharged output signal line and an active high voltage level in the presence of the external address consistent with the defective address. The precharging unit not only charges the output signal line to the active high voltage level before arrival of the external address, but also keeps the output signal line at the active high voltage level even if a current path is undesirable established form the output signal line to a discharge line in the presence of the external address consistent with the defective address, thereby preventing the defective word line from being undesirably accessed.

SUMMARY OF THE INVENTION

Therefore, it is an object of the present invention to eliminate multiselection of regular and redundant word lines in a semiconductor memory array.

It is another object of the present invention to eliminate multiselection of regular and redundant word lines in a semiconductor memory array by using a last address to eliminate false redundant or regular word line generation.

Accordingly, a semiconductor memory array having an associated redundant array for replacing bad words in the semiconductor memory array also includes a latest address switching circuit which prevents multiselection of regular and redundant word lines to eliminate false redundant or regular word line generation.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWING

For a more complete understanding of the present invention, and the advantages thereof, reference is now made to the following descriptions taken in conjunction with the accompanying drawings, in which:

FIG. 4 including

DETAILED DESCRIPTION OF A PREFERRED EMBODIMENT OF THE INVENTION

Figure 1:
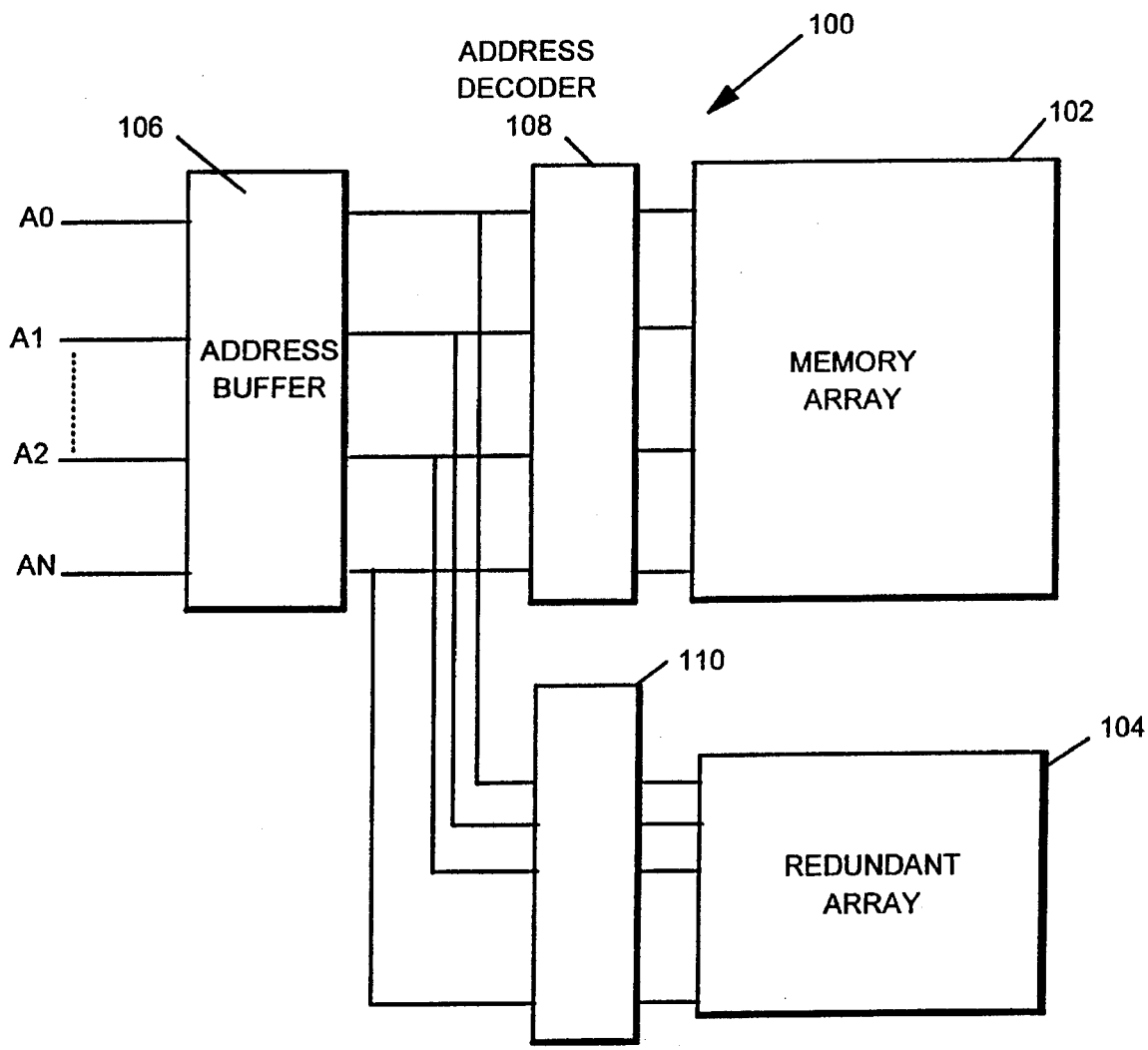
FIG. 1 is a block diagram showing a memory system implementing the present invention.

In the following description, numerous specific details are set forth such as specific word or byte lengths, etc. to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Referring now to FIG. 1, a memory system implementing the present invention will be described.

Address lines A0–An are input to address buffer 106. The address lines A0–An may include the true and complement value of each address line. Outputs of address buffer 106 are connected to a first address decoder 108 for the primary memory array 102 and to a second address decoder 110 which decodes addresses and drives redundant array 104.

Since failures in memory cells occur from time to time, redundant arrays such as 104 are used to avoid replacing a memory array since a word line from a redundant array may be selected and used to replace a failing word line in the primary array 102.

Figure 2A:
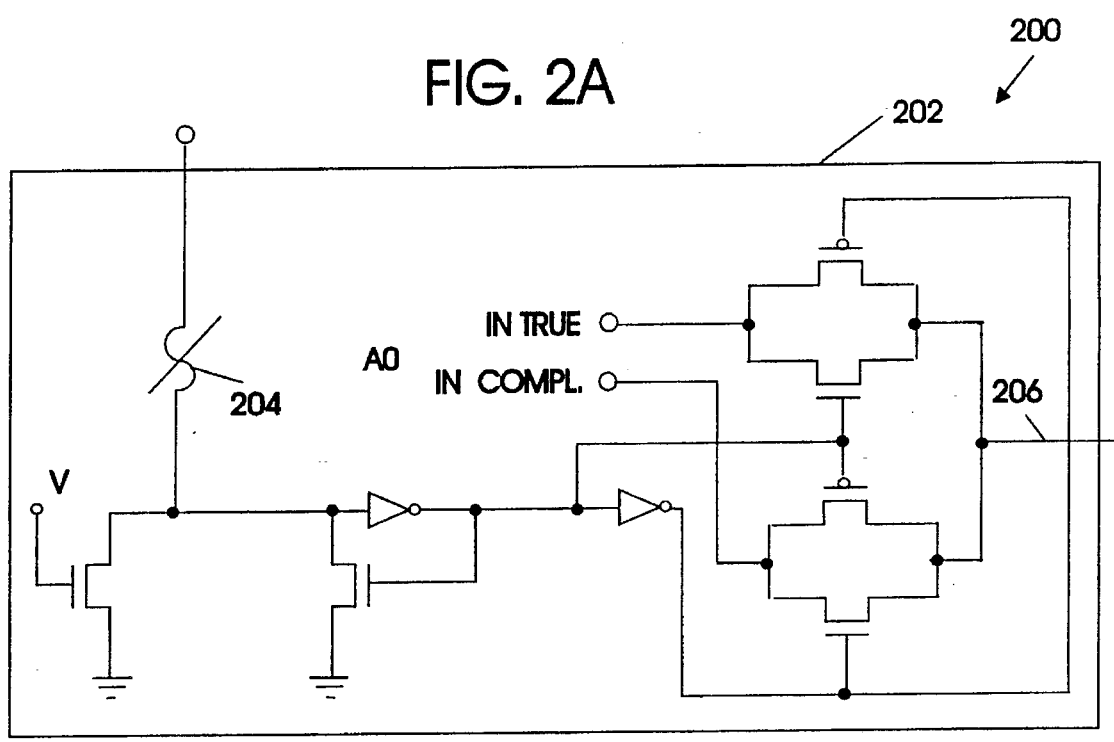
FIGS. 2A and 2B is a circuit diagram of a prior art redundant word line generator.
Figure 2:
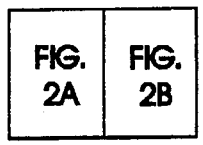
FIG. 2 including
Figure 2:
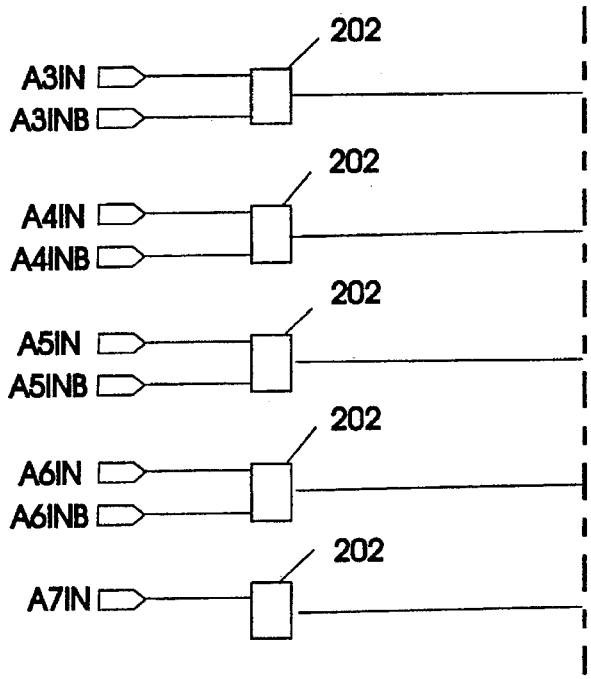
Figure 2B:
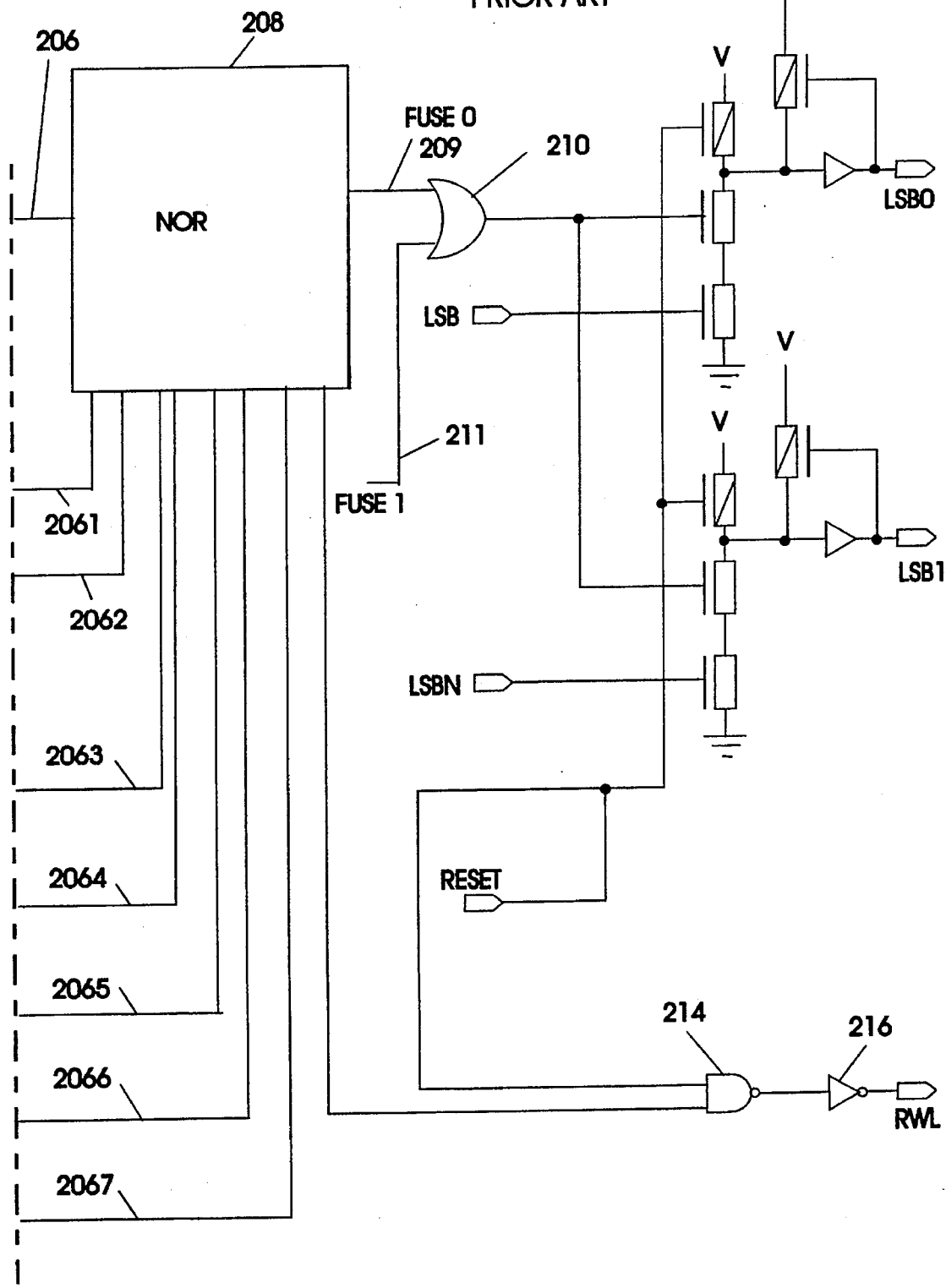

Referring now to FIG. 2, a prior art redundant word line generator will be described.

At the heart of the redundant word line generator circuit 200 is a plurality of fuse circuits 202. The inputs to fuse circuits 202 are the true and complement address bits such as for address lines A0 through A7 inclusive. If the fuse 204 is intact, (not blown) the complement address is allowed to propagate through the fuse circuit to output line 206 and the true address line is blocked.

If, however, the fuse is blown (open) then the complement address is blocked and the true address is propagated to fuse circuit output 206. The default state of input address lines is low. The outputs 2060–2067 inclusive of fuse circuits 202 are connected as inputs to NOR circuit 208. If the primary word line is selected, then one or more of the eight fuse circuit outputs 2060–2067 are forced high, discharging node 209 (the output of NOR circuit 208). All fuse circuit outputs remain at a low level if a redundant word line is selected rather than a primary word line. The output of NOR 208 on line 209 may be referred to as fuse0 and is connected to a first input of OR circuit 210. A second input to OR circuit 210 is an output (FUSE1) from a second NOR circuit (not shown) which combines signals from a second set of eight fuse circuits producing an active signal if the redundant word line rather than the primary word line is selected.

Input lines LSB and LSBN represent the true and complement value of the array select signal. Either LSB or LSBN goes high whenever the array is selected. If it is assumed that addresses do not match in fuse circuits 202, then one or more fuse circuit outputs 2060–2067 are forced high which discharges node 209 (FUSE0) to ground. If FUSE1 on line 211 is low and LSB 213 is high, then LSB0 is forced high. In this case, the primary word line is generated.

If a redundant word line is to be generated, all fuse circuit outputs 2060–2067 are low. FUSE0 will stay high and line RWL (the output of NAND 214 through inverter 216) will go high leaving LSB0 and LSB1 deselected.

The prior art circuit described above with reference to FIG. 2, does not handle skew between address bits which are supposed to bring a fuse circuit output high. If one of the address bits arrives at a fuse circuit late, then first the redundant word line is selected and later the primary word line is selected, a multiselection which results in destruction of data in the array because the two word lines are selected in the same cycle without precharging bit lines.

The solution to the problems presented by the prior art circuit of FIG. 2 is contained in Applicant's invention which will now be described with reference to FIGS. 3, 4, 5, and 6.

Figure 3A:
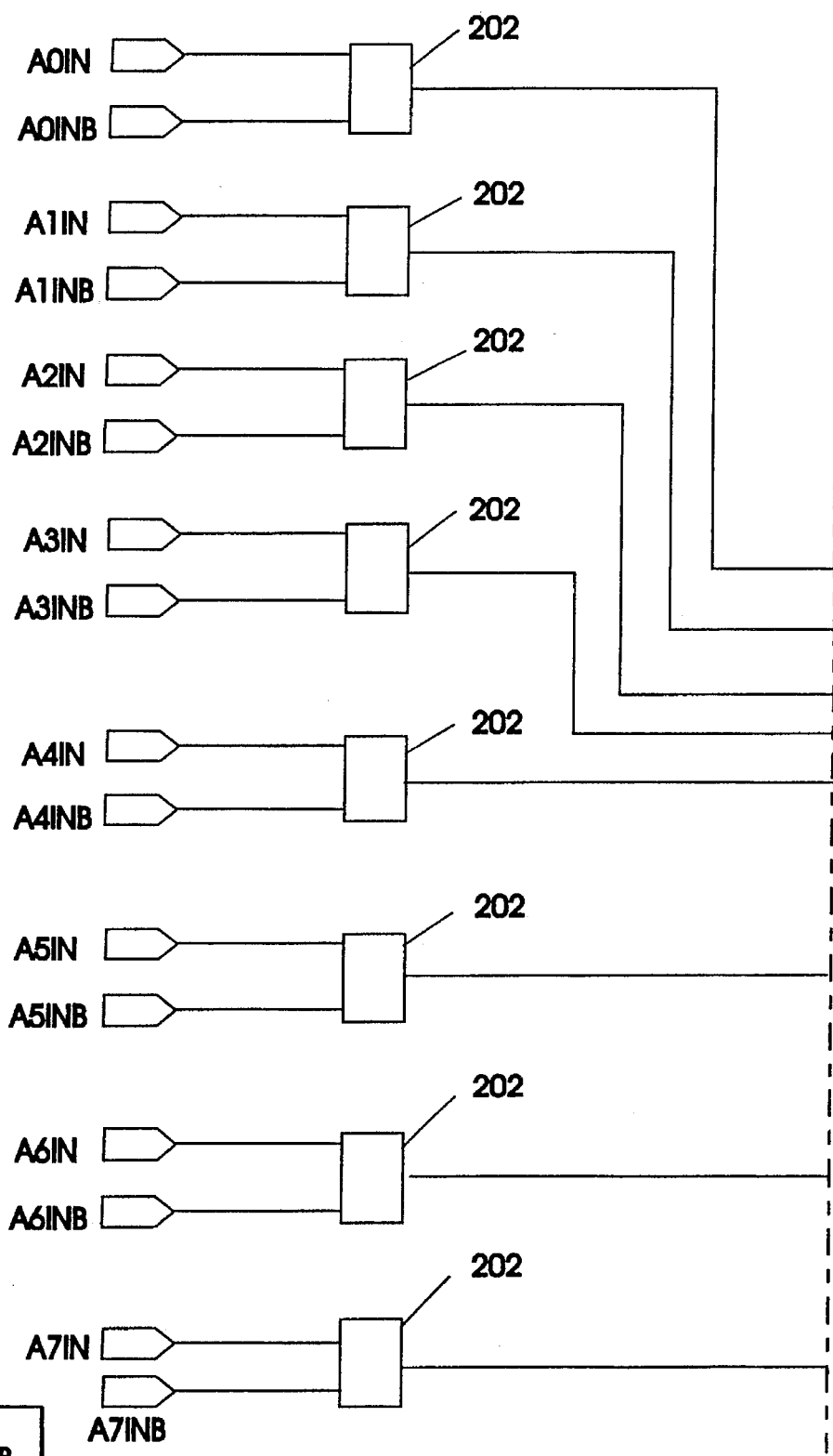
FIG. 3 including FIGS. 3A, B, and C is a circuit diagram of a latest address single select word line generator in accordance with the present invention.
Figure 3:
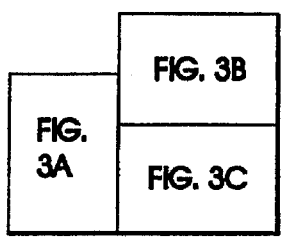
Figure 3B:
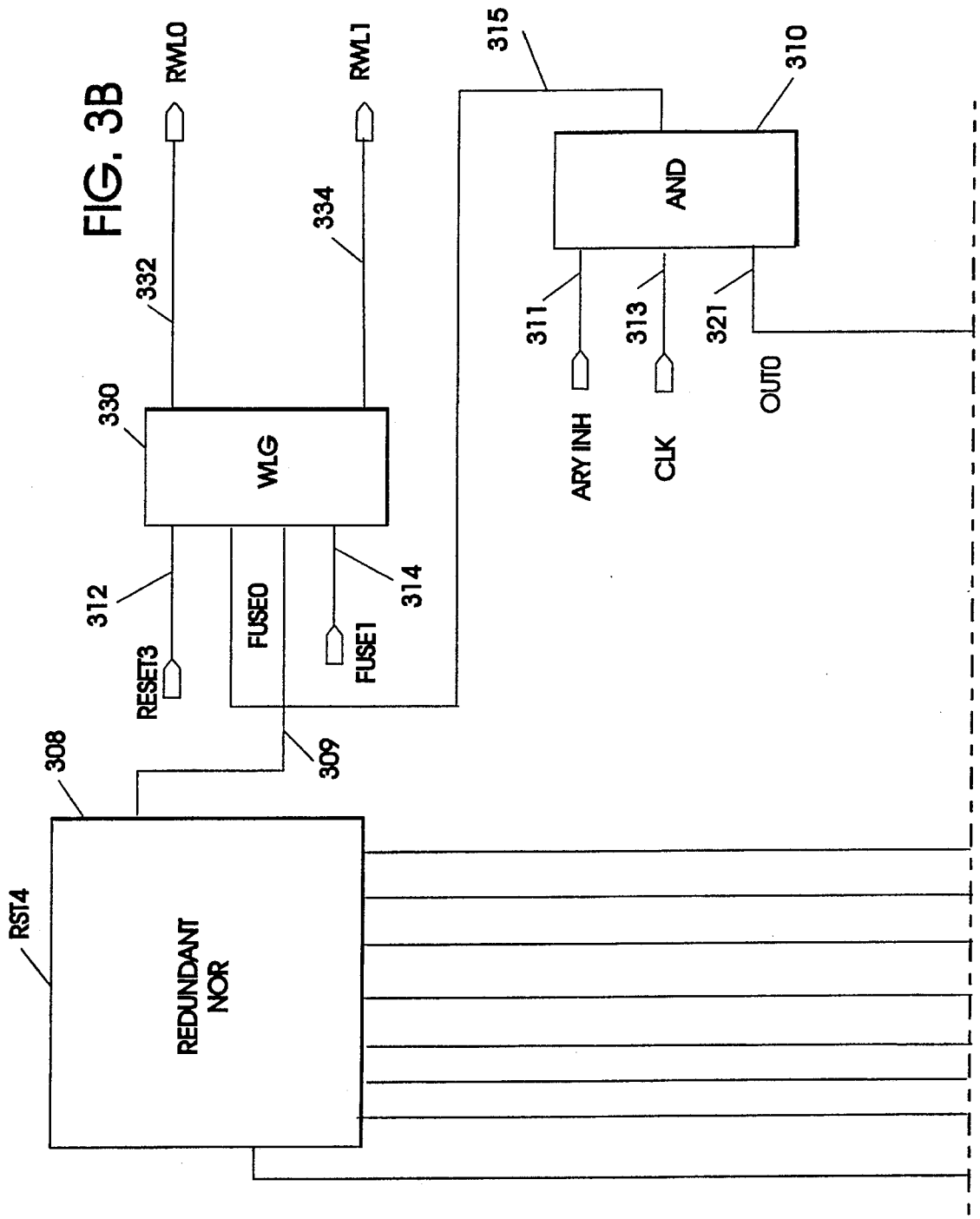
Figure 3C:
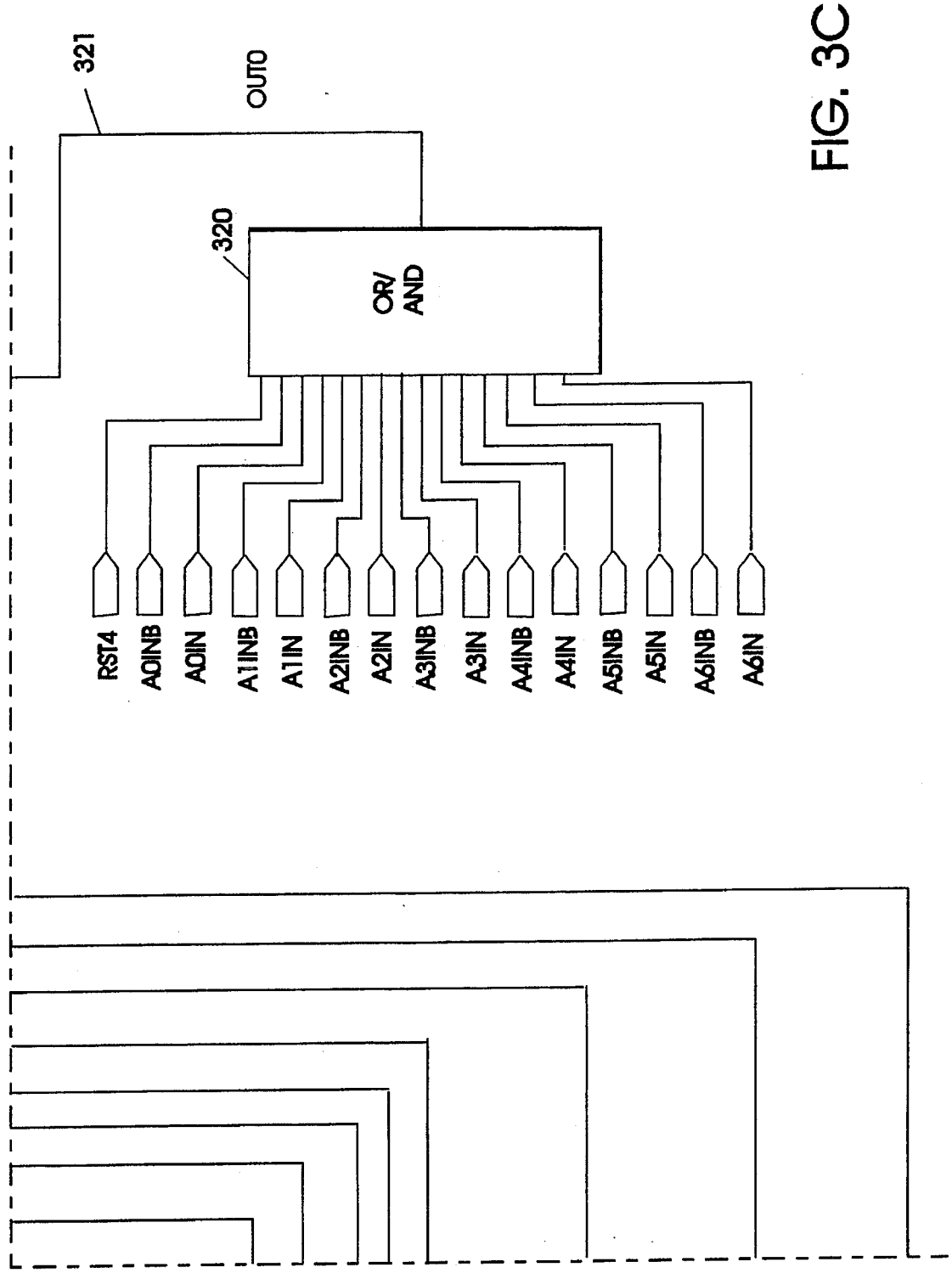

Referring to FIG. 3, a circuit embodying the present invention will be described. As above, the true and complement values of address bits A0–A7 inclusive are input to a plurality of fuse circuits 202. The outputs of fuse circuits 202 are connected to inputs of redundant NOR circuit 308. Circuit 308 may also be referred to as an evaluation circuit.

The true and complement values (A0–A6 and A0B–A6B) are input to OR/AND circuit 320 along with a reset signal RST4. The output of OR/AND circuit 320 on line 321 is labeled OUT 0 and is an input to AND circuit 310. Other inputs to AND circuit 310 are array inhibit on line 311 and clock on line 313. The output of AND circuit 3 10 drives word line generator 330 which also has as inputs, line 309 which is the output of redundant NOR circuit 308 referred to as fuse 1, fuse 0 on line 314 and reset 3 on line 312.

Figure 4A:
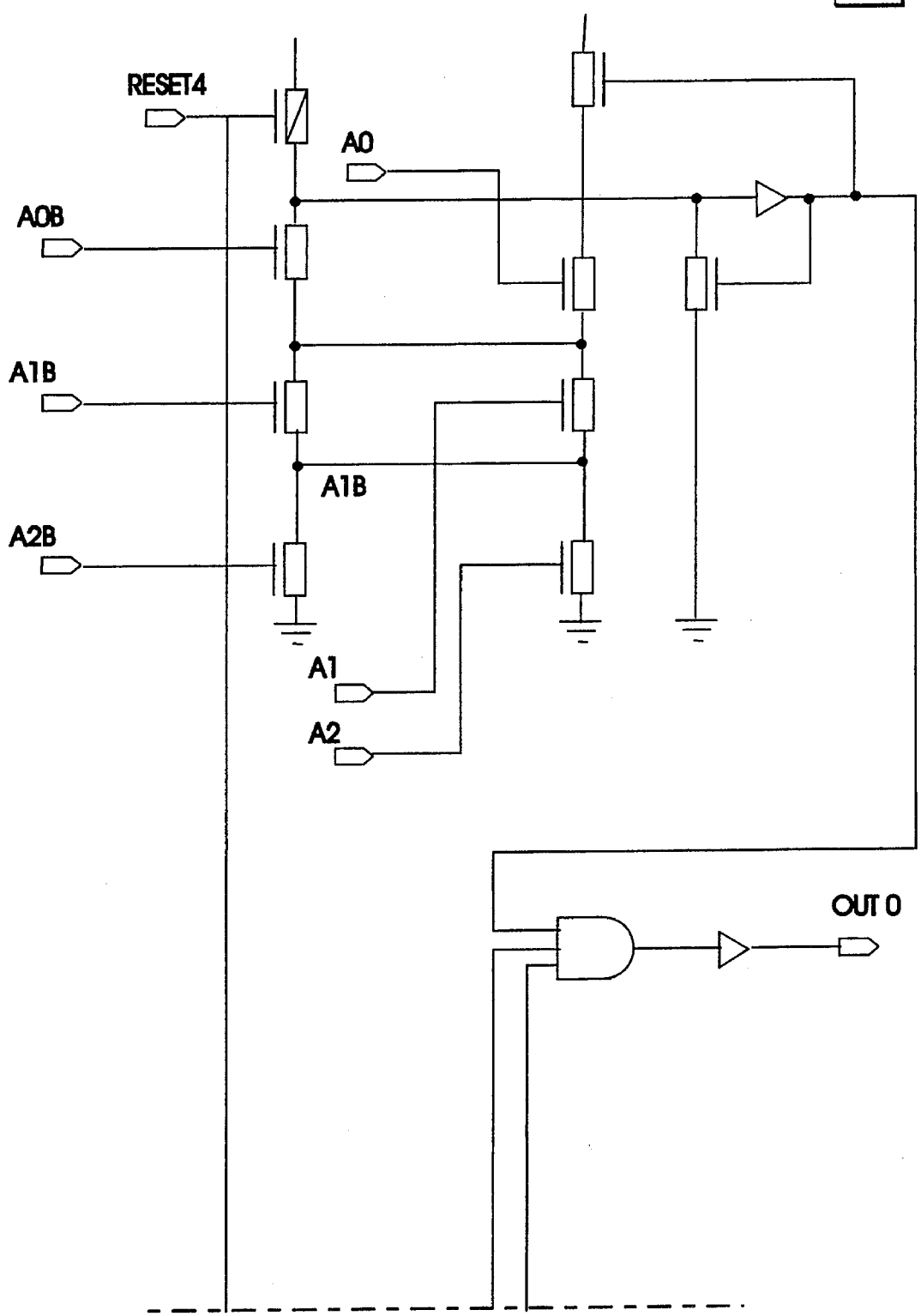
FIGS. 4A and 4B is a circuit diagram of the OR/AND circuit of FIG. 3.
Figure 4B:
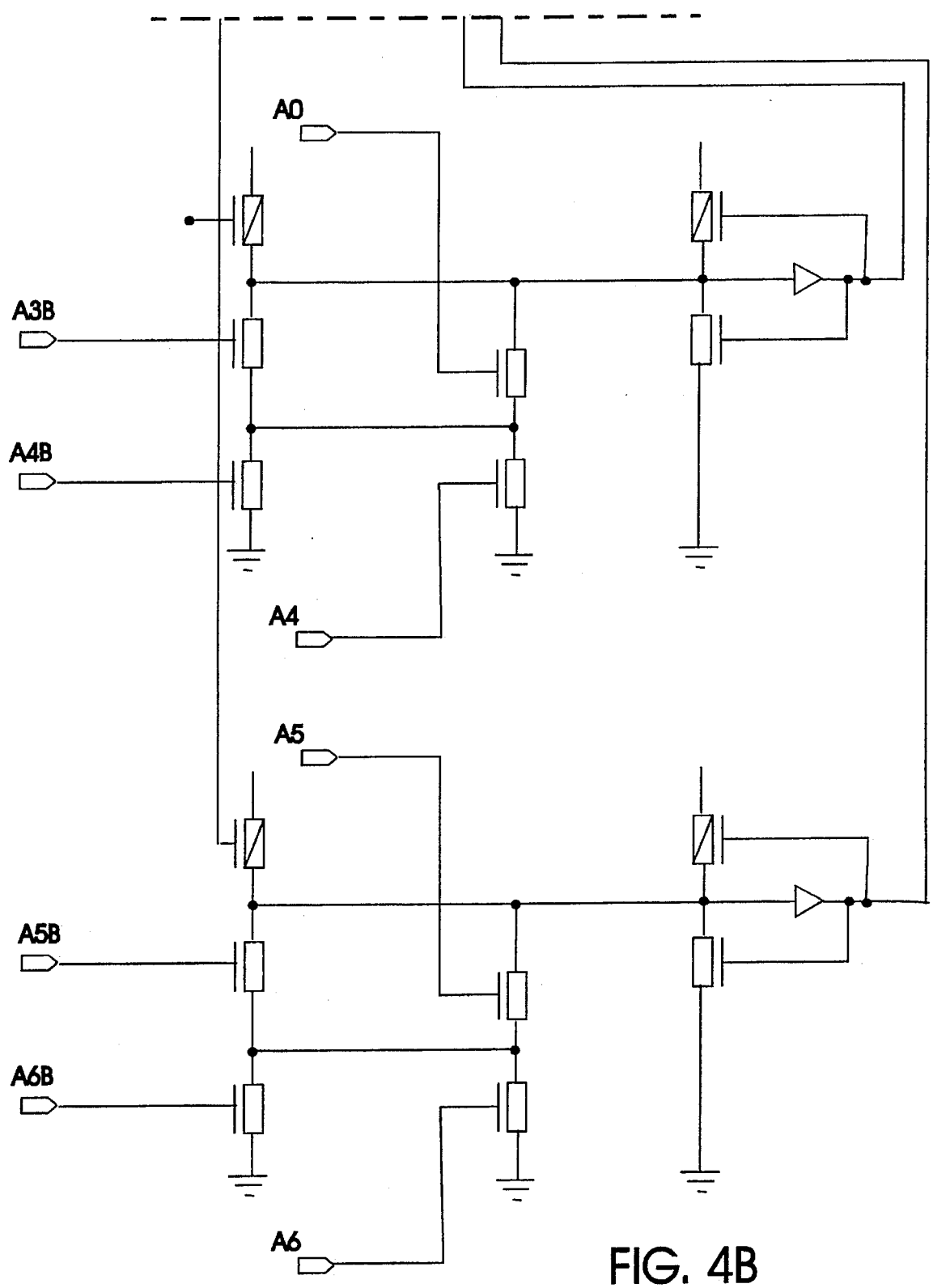
Figure 5:
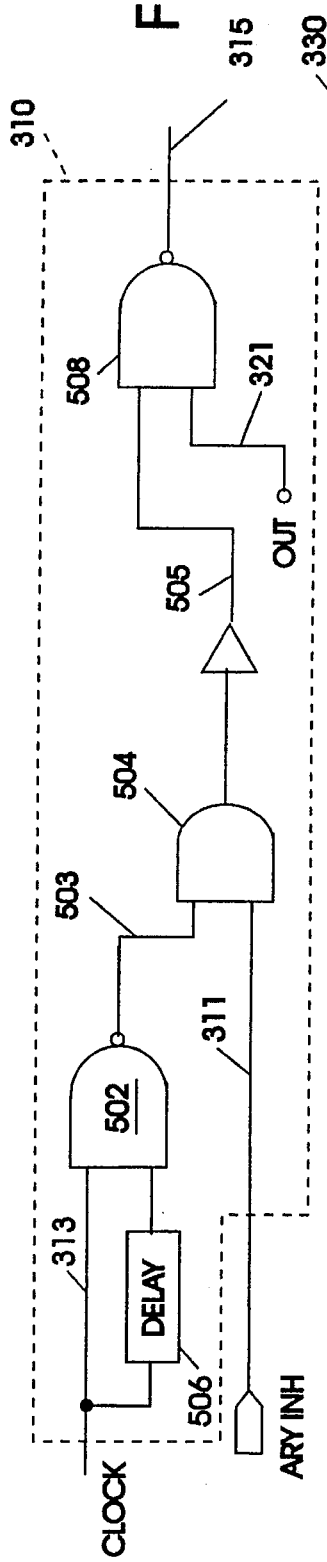
FIG. 5 is a circuit diagram of the clocked AND circuit of FIG. 3 in accordance with the present invention.

Referring now to FIG. 4, the OR/AND circuit 320 will be described. Circuit 320 may also be referred to as a latest address circuit, since the output on line 320 is controlled by the last address line to become active at an input to circuit 320. The true and complement values of row addresses A0–A6 are ored together and then the results are anded together to generate the signal OUT0 on line 321. At the beginning of each cycle, clock signal on line 313 goes low and reset4 pulses from high to low. This action precharges the outputs of the OR portion of circuit 320. After the clock signal on line 313 goes low, and after a small delay, either the true or complement row addresses (A0–A6) are forced high. This causes the internal nodes which are inputs to the AND portion of circuit 320 high. After a predetermined delay, OUT0 signal on line 321 is forced high. The precharged state of all of the row addresses (A0–A6) is low.

It is important to note that the latest address arriving as an input to circuit 320 sets the circuit and forces OUT 0 on line 321 high. This means that if address signals are coming from a long distance, the circuit waits for the last address to arrive before switching. This eliminates false redundant or regular word line generation. The clock line 313 and the OUT 0 signal line 321 are connected as inputs to NAND circuit 502. (see FIG. 5)

It should be noted that if the array inhibit signal on line 311 is high, the array is not selected.

If however, array inhibit on line 311 is low, the array is selected and the output of NAND circuit 508 on line 315 is dependant on the output of NAND 502 which represents a delayed clock pulse. When the delayed clock signal is high, line 505 is high which allows the output of NAND on 508 on line 305 to go high when line 321 goes high.

In a practical embodiment, having a short clock cycle of 2.7 nanoseconds cycle time, addresses take approximately 1.5 nanoseconds to reach the input of OR/AND circuit 320. Another 0.5 nanoseconds is required to generate the output of OR/AND circuit 320 on line 321. By that time (2 nanoseconds later), the clock signal has gone high, assuming a 50% duty cycle, which forces line 505 (see FIG. 5) high. The output of circuit 310 on line 315 follows the input on line 321.

Figure 6:
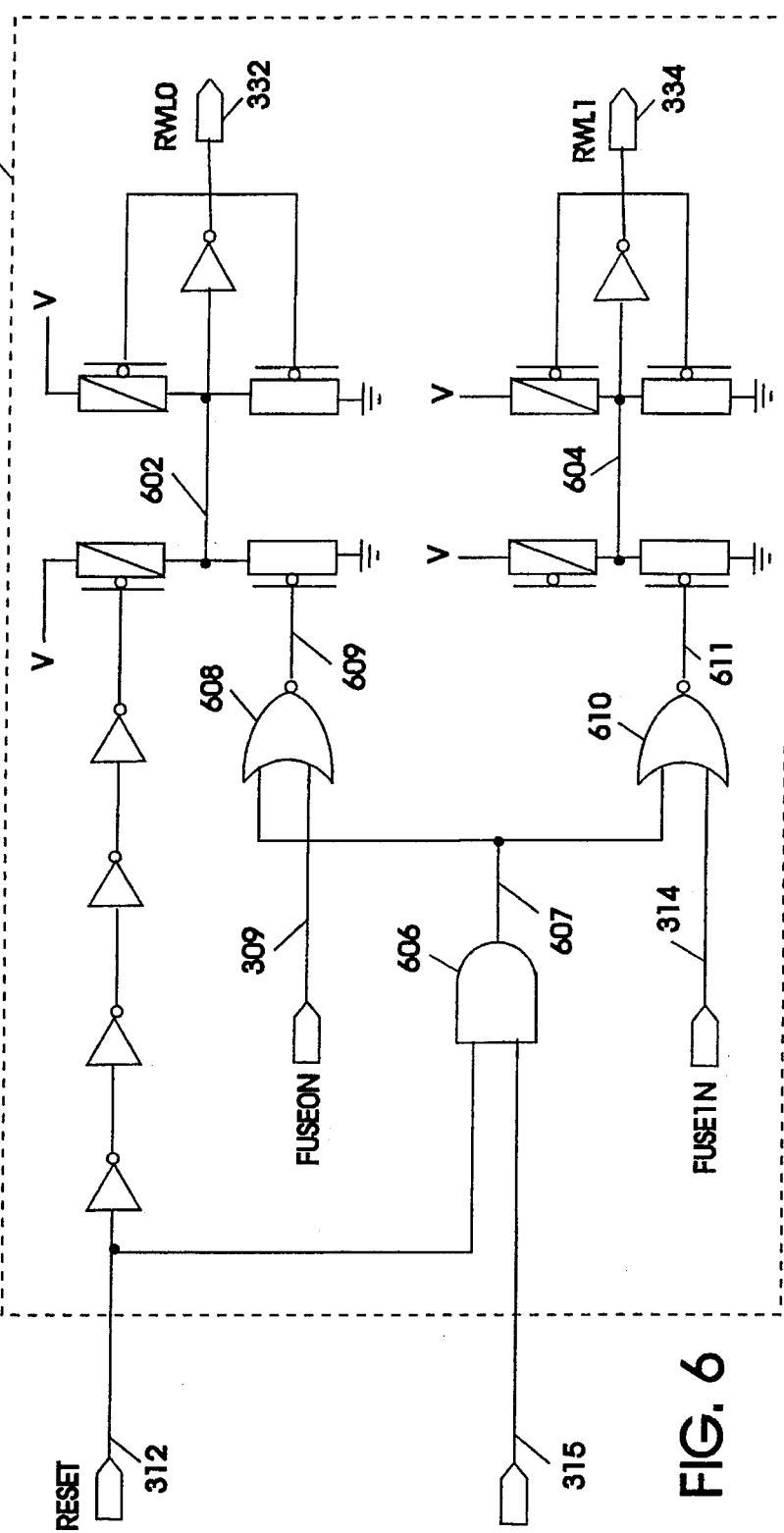
FIG. 6 is a circuit diagram of a redundant word line generator in accordance with the present invention.

Referring now to FIG. 6, the redundant word line generator circuit 330 will be described in greater detail. Reset on line 312 goes low at the beginning of each clock cycle. This precharges nodes 602 and 604 to a supply Voltage. If a redundant word line is selected, either FUSE0N on line 309 or FUSE1N on line 314 will remain low (the precharged state). When line 315 goes high and a reset on line 312 is high, NAND circuit 606 forces line 607 low. If fuse 0N line 309 is low, then the output on line 609 of NOR circuit 608 is high and line 602 is forced low. This action generates the redundant word line RWL0 on line 332. If fuse 0N is high and fuse 1N is low, line 611 which is the output of NOR 610 is forced high and line 604 is forced low which results in generation of the primary word line RWL1 on line 334.

Since the apparatus for the most part is composed of electronic components and circuits known to those skilled in the art, circuit details will not be therefore explained to any greater extent than necessary for understanding and appreciating the underlying concepts of the present invention.

Although the present invention and its advantages have been described in detail, it should be understood that various changes, substitutions and alterations can be made herein without departing from the spirit and scope of the invention as defined by the appended claims.

What is claimed is:

1. A memory for storing data in a data processing system, comprising:

a primary array of storage cells;

a secondary array of storage cells; and a storage cell selection circuit for selecting a plurality of storage cells from one of said arrays of storage cells, said selection circuit comprising:

a first plurality of circuits for selecting between a true and a complement value of a plurality of address lines;

a logic circuit having a plurality of inputs, each of said inputs connected to an output of one of said first plurality of circuits, said logic circuit generating an active output if one or more of said first plurality of circuits generates an active output; and an address gating circuit, having a plurality of inputs, each of said inputs to said address gating circuit connected to one of said plurality of address lines, said address gating circuit producing an output when a last of said input lines to become active has become active, the output of said address gating circuit being connected to a gating circuit to enable selection of storage cells when said output of said address gating circuit becomes active.

2. A memory, according to claim 1, further comprising a word line generator responsive to an output of said logic circuit and said output of said address gating circuit for driving a word line in one of said arrays of storage cells.

3. A memory, according to claim 1, wherein said first plurality of circuits comprise fuse circuits.

4. A memory, according to claim 1, wherein outputs of at least two of said first plurality of circuits are connected as inputs to said word line generator to gate selection of said primary or secondary array of storage cells.

* * * * *